US005800623A

United States Patent [19]

Dyer

[11] Patent Number: 5,800,623
[45] Date of Patent: Sep. 1, 1998

[54] SEMICONDUCTOR WAFER SUPPORT PLATFORM

[75] Inventor: Timothy Scott Dyer, Tempe, Ariz.

[73] Assignee: Accord SEG, Inc., Tempe, Ariz.

[21] Appl. No.: 683,363

[22] Filed: Jul. 18, 1996

[51] Int. Cl.⁶ ........................................... C23C 16/00
[52] U.S. Cl. ...................... 118/728; 118/723 E; 118/500; 156/345
[58] Field of Search ..................... 118/728, 723 E, 118/500; 156/345; 219/634, 638, 730, 86.25

[56] References Cited

U.S. PATENT DOCUMENTS

| | | | |
|---|---|---|---|
| 5,213,650 | 5/1993 | Wang et al. | 156/345 |
| 5,558,717 | 9/1996 | Zhao et al. | 118/715 |
| 5,569,350 | 10/1996 | Osada et al. | 156/345 |
| 5,665,166 | 9/1997 | Deguchi et al. | 118/723 E |
| 5,665,167 | 9/1997 | Deguchi et al. | 118/728 |
| 5,688,331 | 11/1997 | Aruga et al. | 118/725 |
| 5,700,725 | 12/1997 | Hower et al. | 437/225 |
| 5,730,803 | 3/1998 | Steger et al. | 118/723 R |

*Primary Examiner*—R. Bruce Breneman
*Assistant Examiner*—Jeffrie R. Lund
*Attorney, Agent, or Firm*—Herbert M. Shapiro

[57] ABSTRACT

Premature equipment failure of susceptors used during plasma processing of semiconductor wafers is avoided by making the holes, characteristic of susceptors, such that the hole diameter is less that the susceptor thickness. In one embodiment, the susceptor includes a pattern of support struts which permits the planar top plate of the susceptor to be made quite thin and yet permits the diameter-to-thickness requirement to be met by aligning the pattern of holes with the pattern of support struts and having the holes penetrate the struts.

5 Claims, 2 Drawing Sheets

SEMICONDUCTOR WAFER SUPPORT PLATFORM

FIELD OF THE INVENTION

This invention relates to a support platform, called a "susceptor" on which a semiconductor wafer, is placed for plasma processing. The susceptor not only maintains the wafer in place, but also acts as a negative potential electrode during plasma processing.

BACKGROUND OF THE INVENTION

During plasma processing of semiconductor wafers, a wafer is positioned on pins which extend through holes in the susceptor on which the wafer is positioned. The pins are supported on waferlift fingers extending from a hoop which occupies a position about the susceptor and which is raised and lowered controllably for positioning the pins to properly seat the wafer on the top surface of the susceptor.

The susceptor is fabricated from anodized aluminum and is considered to be a consumable by the equipment suppliers. Therefore, susceptors are not covered by warranty. But, they are expensive and subject to premature failure. Consequently, susceptors are somewhat unreliable and cause unexpected equipment downtime as well as expense.

Susceptors are characterized also by a variety of other problems: For example, nodules form on the susceptor surface; anodization flaking occurs; plates get too hot; wafers stick to the susceptor surface; and pin hole arcing occurs. The latter is the most severe of these problems and it is primarily the problem which the present invention addresses.

BRIEF DESCRIPTION OF THE INVENTION

In accordance with the principles of this invention, the susceptor holes have specific geometries and hole diameters/susceptor thickness ratio is chosen to be less than one so that the "dark space", characteristic of a plasma discharge, protects the holes and thus prevents arcing from occurring. For plasmas of conventional levels of between four and nine Torr, susceptors, fabricated with hole diameter to susceptor thickness ratios, as prescribed in accordance with the principles of this invention, exhibit no arcing and premature failure of susceptors is essentially eliminated.

Further, the use of high purity aluminum alloys avoids nodule formation and etching with a sulfuric acid/oxalic acid bath avoids anodization flaking. A susceptor, in one embodiment of this invention, also includes a unique support structure which not only provides rigidity to the susceptor, but also reduces costs, permits rapid heat cycling of the susceptor and permits the hole diameter/susceptor thickness requirement to be met without also requiring the susceptor to be excessively thick.

BRIEF DESCRIPTION OF THE DRAWINGS

FIG'S. 1, 2, and 3 are schematic top, cross section and bottom views of a susceptor in accordance with the principles of this invention.

DETAILED DESCRIPTION OF AN ILLUSTRATIVE EMBODIMENT OF THIS INVENTION

Figure 1:
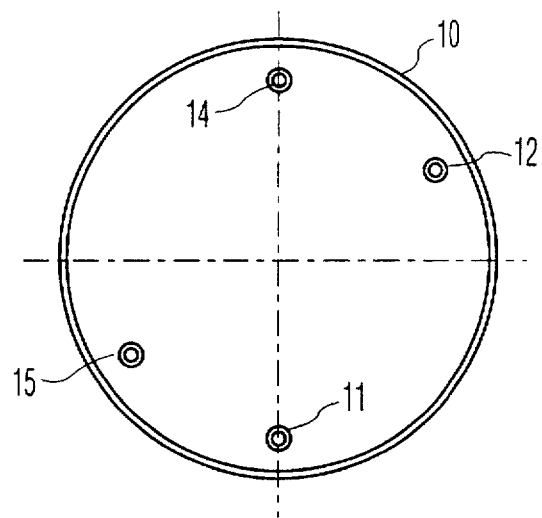

FIG. 1 shows a top view of a susceptor 10, circular in shape and having a pattern of four holes 11, 12, 14, and 15.

During plasma processing of a semiconductor wafer (not shown), the wafer sits oil top of insulating (ceramic) pins extending through the holes. The pins initially extend above the top surface of the planar member (susceptor) to receive the wafer. The pins are then lowered along the vertical axes of the holes to lower the wafer into contact with the susceptor during processing. The susceptor is fabricated from anodized aluminum but is not electrically insulating for radio frequency (i.e. 13.56 megaherz) signals.

The susceptor of FIG. 1 is analogous to prior art susceptors except for the hole diameter (D) to susceptor thickness (T) ratio which is less than one in accordance with the principles of this invention. A susceptor herein also includes the rounding of the periphery of each hole where it meets the surface(s) of the receptor. In an illustrative example, each hole has a diameter of about 0.11 inch and the holes are spaced apart 4.11 inches. The thickness of the susceptor is 0.420 inch. The hole diameter, D, is clearly less than the susceptor thickness, T.

Figure 2:
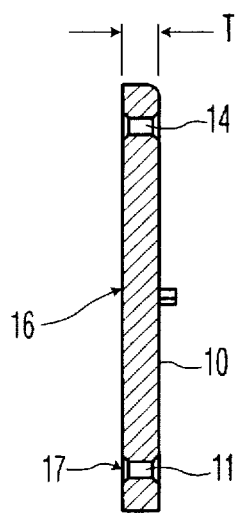

The thickness of the susceptor of FIG. 1 is shown more clearly in FIG. 2. The depth of the hole (i.e. the thickness F) is maintained large compared to the diameter of a hole to prevent the plasma from penetrating the hole and to avoid arcing by keeping the "sheath" or "dark space" (of about ten millimeters) at the hole surface. If the plasma, penetrates the hole, the dark space is not in a position to prevent arcing.

Further, the periphery of each hole is rounded, particularly at the top surface 16 of the susceptor as shown in FIG. 2. The figure shows rounding at both the top and bottom surfaces and is only designated by arrow 17 for hole 11 and only at the top surface of that hole.

Figure 3:
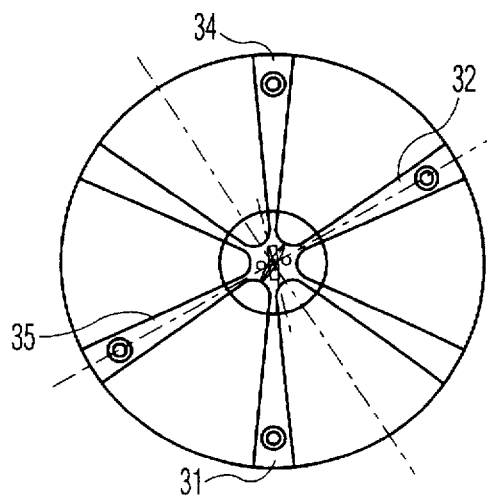

FIG. 3 shows the underside of an illustrative six inch susceptor of the type shown in FIG'S. 1 and 2 except that it includes ribs or struts 31, 32, 34, and 35 which are positioned to correspond to the positions of the holes (i.e. 11, 12, 14, and 15) respectively. Note that the holes, in this embodiment, penetrate entirely through the struts and the thickness (T), in this embodiment, includes the thickness of the planar member (i.e. of FIG. 1) plus the thickness of the strut, thus permitting a thinner planar, member to be achieved without unduly constraining the hole diameter. The thinner the planar member, the faster the heat cycle time for the susceptor. Consequently, there is an incentive to reduce the thickness of the susceptor. The use of struts for support permits such a thickness reduction so long as the holes are aligned with the struts.

Figure 4:
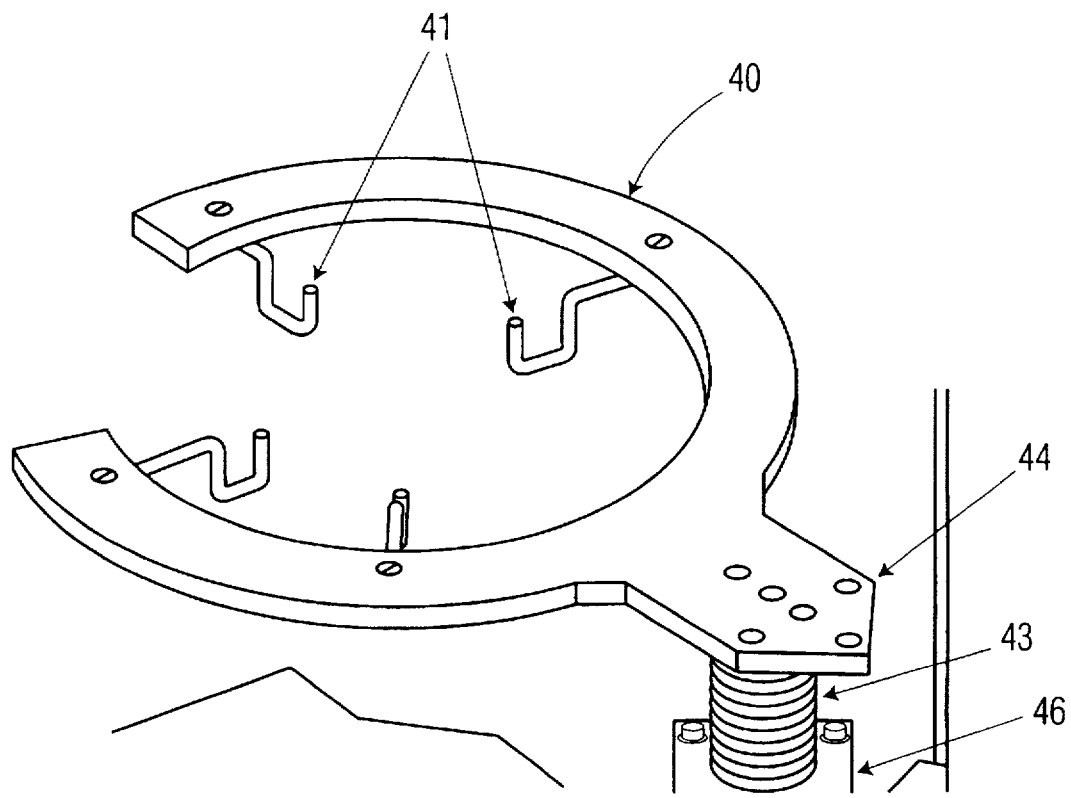
FIG. 4 is a schematic illustration of a pin lift assembly for a susceptor of the type shown in FIG'S. 1 and 2, or 3.
Figure 5:
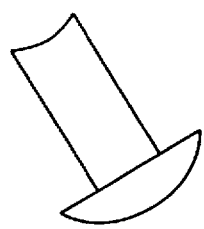
FIG. 5 is a schematic illustration of a pin for use with the loop assembly of FIG. 4.

FIG. 4 shows a metal "waferlift" hoop 40 which encircles a susceptor and which has waferlift fingers, 41 positioned to align with the holes of the susceptors of FIG'S. 1 or 3. Pins of the type illustrated in FIG. 5 are attached to the waferlift fingers for insertion into the holes during operation. The pins are moved along the vertical axes of the holes in response to the inflation and deflation of a bellows 43. The bellows is connected between an upper bellows flange 44, which is part of hoop 40, and a lower bellows flange 46 as shown in FIG. 4. The positioning of the hoop is operator controlled in conventional fashion and a discussion thereof is not necessary for an understanding of this invention.

What is claimed is:

1. A susceptor for supporting a semiconductor wafer, said susceptor comprising a first member having a thickness T, said member having a planar surface and a pattern of holes through said first member, each of said holes having a diameter D less than T, wherein said first member includes a pattern of support struts, said pattern of support struts corresponding to said pattern of holes wherein each of said holes penetrates through a corresponding one of said struts, said first member and said struts having an overall thickness T.

2. A susceptor as in claim 1, in combination with a hoop positioned beneath said first member and including thereon a pattern of upstanding pins corresponding to said pattern of holes, also including means for moving said hoop along a vertical axis for moving said pattern of pins through said holes for receiving a semiconductor wafer.

3. A susceptor as in claim 1 including a cathode assembly comprising a hoop positioned beneath said pattern of support struts and including thereon a pattern of upstanding pins corresponding to said pattern of holes, said cathode assembly including means for moving said hoop along a vertical axis for moving said pattern of pins through said holes for receiving a semiconductor wafer.

4. A susceptor as in claim 1 wherein each of said holes has a rounded edge at the top surface thereof where it intersects the top surface of said first member.

5. A susceptor as in claim 1 wherein said first member comprises electrically conducting material and said hoop and said pins comprise electrically insulating material.

\* \* \* \* \*